(12) United States Patent
Hyacinthe et al.

(10) Patent No.: US 7,634,368 B2
(45) Date of Patent: Dec. 15, 2009

(54) MODULAR DATA LOGGER

(75) Inventors: John Wesley Hyacinthe, Plantation, FL (US); Bruce Spiegel, Coral Springs, FL (US)

(73) Assignee: Fluke Electronics Corporation, Everett, WA (US)

( * ) Notice: Subject to any disclaimer, the term of this patent is extended or adjusted under 35 U.S.C. 154(b) by 0 days.

(21) Appl. No.: 11/345,497

(22) Filed: Feb. 2, 2006

(65) Prior Publication Data

US 2007/0179718 A1    Aug. 2, 2007

(51) Int. Cl.
*G06F 19/00* (2006.01)
(52) U.S. Cl. .................................... 702/57
(58) Field of Classification Search ............ 702/57
See application file for complete search history.

(56) References Cited

U.S. PATENT DOCUMENTS

| | | | | | |
|---|---|---|---|---|---|
| 3,816,815 | A | * | 6/1974 | Schumann | 324/112 |
| 4,823,283 | A | * | 4/1989 | Diehm et al. | 715/825 |
| 5,541,840 | A | * | 7/1996 | Gurne et al. | 701/33 |
| 5,923,161 | A | * | 7/1999 | Frankovitch et al. | 324/115 |
| 6,362,540 | B1 | * | 3/2002 | Hill | 307/52 |
| 6,636,789 | B2 | * | 10/2003 | Bird et al. | 701/29 |
| 6,678,176 | B2 | * | 1/2004 | Lumsden | 363/95 |
| 6,823,243 | B2 | * | 11/2004 | Chinnadurai et al. | 701/29 |
| 2002/0074990 | A1 | * | 6/2002 | Shincovich | 324/110 |
| 2003/0040881 | A1 | * | 2/2003 | Steger et al. | 702/123 |
| 2004/0253997 | A1 | * | 12/2004 | Kochie | 455/575.1 |
| 2005/0187593 | A1 | * | 8/2005 | Housworth et al. | 607/60 |

OTHER PUBLICATIONS http://en.wikipedia.org/wiki/RS232, pp. 1-11.*
http://en.wikipedia.org/wiki/Bluetooth, p. 1-19.*
http://en.wikipedia.org/wiki/Infrared, p. 1-21.*
Internet printout of LeCroy WaveSurfer products (Feb. 2, 2006).

* cited by examiner

*Primary Examiner*—Tungs S Lau
(74) *Attorney, Agent, or Firm*—Perkins Coie LLP (57) ABSTRACT

A computer-based apparatus for the collection, processing and distribution of electrical data, having a substantially sealed shell capable of resisting environmental contamination. The shell having a plurality of ports with each port configured to couple to an electrical probe, wherein within the shell are disposed, at least the following: a data acquisition system coupled to the ports, a processing system coupled to the data acquisition system, and a communication system coupled to the processing system.

20 Claims, 8 Drawing Sheets

MODULAR DATA LOGGER

FIELD OF THE INVENTION

The present invention relates generally to data collection and storage. More particularly, the present invention relates to a portable data collecting device capable of remote access and control.

BACKGROUND OF THE INVENTION

Traditionally, there have been a limited number of test devices available to measure and track various electrical signals from various electrical systems, such as an electrical power line network. Such test devices include: oscilloscopes, logic probe and multi-meters. While each of these devices has its strengths, typically they are limited in their utility for certain applications.

For example, oscilloscopes, even storage oscilloscopes, tend to be very expensive, unfit for many environments due to high ambient temperature and humidity and are incapable of storing data beyond a few display "sweeps." Logic probes and multi-meters, while typically more robust in adverse environmental situations, have extremely limited diagnostic capability, no memory of import and can not be accessed remotely. Accordingly, new technology and devices towards data storage and acquisition are desirable.

SUMMARY OF THE INVENTION

The foregoing needs are met, to a great extent, by the present invention, wherein in one aspect an apparatus is provided that in some embodiments comprises a data collector in a substantially sealed shell capable of collecting, storing and transferring data.

In accordance with one embodiment of the present invention, a computer-based apparatus for collection, processing and distribution of electrical data, the apparatus having a substantially sealed shell capable of resisting environmental contamination, the shell having a plurality of ports with each port configured to couple to an electrical probe, wherein within the shell are disposed, at least: a data acquisition system coupled to the ports configured to condition and digitize electrical signals received via the plurality of ports and respective electrical probes to produce a set of digitized electrical signals, a processing system coupled to the data acquisition system, the processing system being capable of performing a variety of computational processes on the digitized electrical signals, and a communication system coupled to the processing system, the communication system being capable of receiving commands from an external computer system, and further being capable of providing data to the external computer system, wherein the computer-based apparatus is configured to receive all of its configuration data via the communication system.

In accordance with another embodiment of the present invention, a data acquisition system is configured to collect electrical data from a plurality of locations, wherein the data acquisition system processes and stores the collected data and deliver the stored data to a common external location, the data acquisition data system comprising: a substantially sealed shell capable of resisting environmental contamination, the shell having a plurality of ports with each port configured to couple to an electrical probe, wherein within the shell are disposed, at least: a data acquisition means for acquiring electrical data from the electrical power lines, a processing means coupled to the data acquisition means for performing a variety of computational processes on the acquired electrical data, and a communication means for receiving commands from an external computer system and for providing data to the external computer system, wherein the computer-based apparatus is configured to receive all of its configuration data via the communication means.

In accordance with yet another embodiment, a method for the collecting, processing and distributing electrical data using a computer-based apparatus having a substantially sealed shell capable of resisting environmental contamination, the shell having a plurality of ports with each port configured to couple to an electrical probe is provided. The method includes the steps of acquiring data using a data acquisition system coupled to the ports configured to condition and digitize electrical signals received via the plurality of ports and respective electrical probes to produce a set of digitized electrical signals, processing the digitized electrical signals to perform a variety of computational processes, receiving commands from an external computer system and communicating the received commands to the processing system and providing processed data to the external computer system based upon a command from the external computer system.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

The invention will now be described with reference to the drawing figures, in which like reference numerals refer to like parts throughout.

Figure 1:
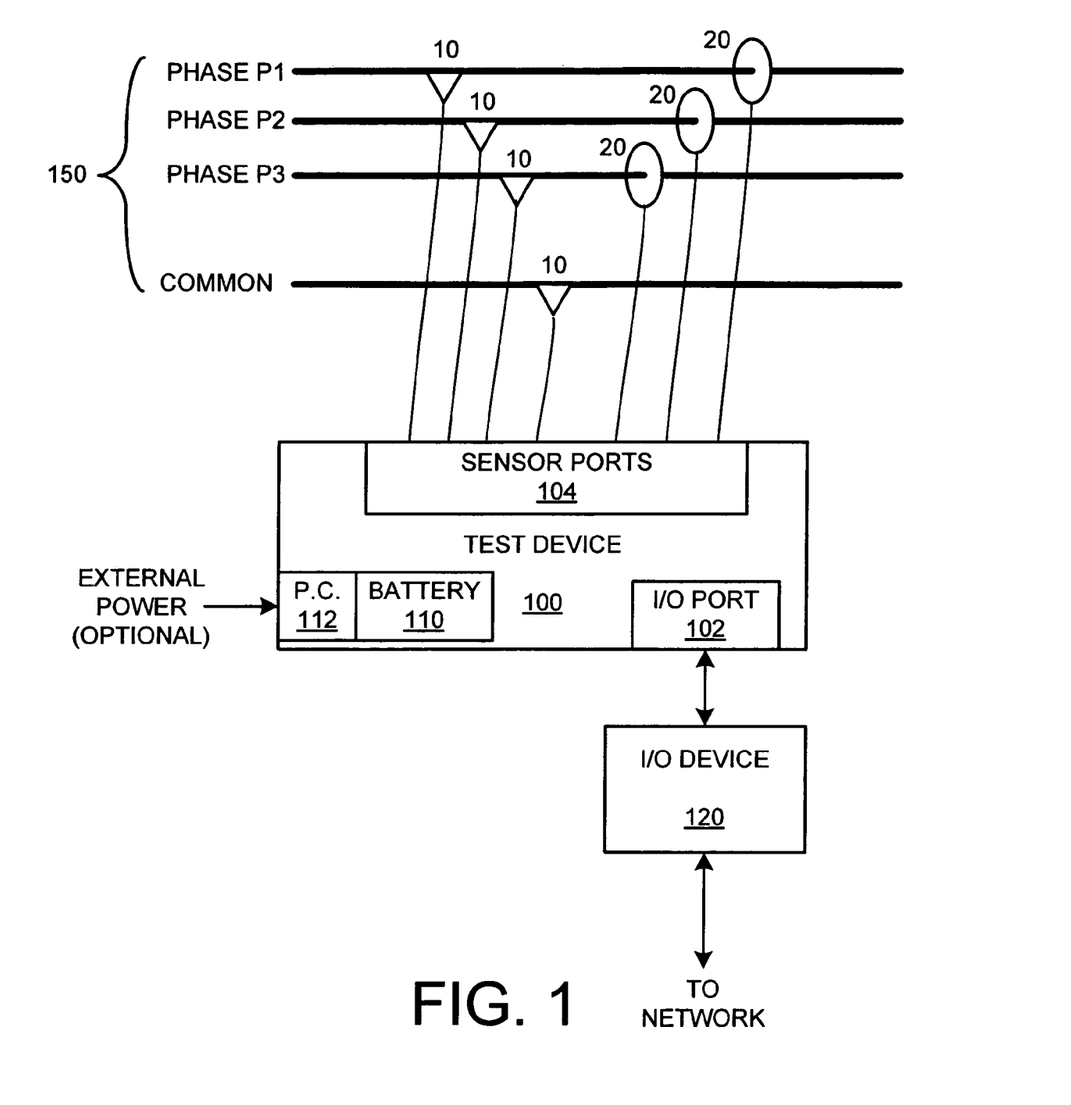
FIG. 1 depicts a three-phase electrical power system along with an exemplary test device and input/output device.

FIG. 1 is a diagram of a three-phase electrical power system 150 having three power lines/phases P1, P2 and P3 with common ground GND accompanied by an electrical test device 100. An I/O device 120 is also included in the present embodiment to facilitate communication between the test device 100 and an external computer-based system (no shown). As shown in FIG. 1, the electrical test device 100 is directly coupled to the three-phase power system 150 via a number of voltage probes 10 connected to each of the electrical system's lines P1, P2, P3 and GND, as well as a number of current probes 20 indirectly coupled to lines P1, P2 and P3. The test device 100 includes an internal battery 110 with power converter/re-charger 112, a number of sensor ports 104 used to couple the voltage probes 10 and the current probes 20 to the test device 100. the test device 100 further includes an I/O port 102 used to couple the electrical test device 100 to the I/O device 120.

In operation, an operator using the electrical test device 100 could program the electrical test device 100 via the I/O device 120 and an external computer-based system. For example, an operator desiring to measure long term frequency shifts in the power system 150 can program the electrical test device 100 to access its various voltage probes 10 and current probes 20 to collect electrical information, process the electrical information to determine instantaneous power line frequency and periodically store such frequency information to derive long term frequency information. Further, the operator can program the electrical test device 100 to automatically download the stored frequency information at regular intervals, or the operator can command the electrical test device 100 to download the desired electrical information upon command.

In addition to monitoring/measuring/storing frequency data, the exemplary test device 100 can also be used to monitor/measure/store any number of steady-state parameters of interest. For example, the test device 100 can be used to monitor/measure/store voltage levels, current levels, voltage-current phase relationships, 3-phase line balance, steady-state noise, harmonic distortion, RMS voltage for all phases, voltage waveform for all phases, voltage frequency for all phases, voltage phase anomalies (sag and surge) for all phases, voltage phase shift between phases 1&2, 2&3, and 3&1, voltage phase sequence, RMS current for all phases, current waveform for all phases, current frequency for all phases, current phase shift between phases 1&2, 2&3, and 3&1, current phase sequence, real power for all phases, apparent power for all phases, reactive power for all phases, true power factor for all phases, displacement power factor, real energy apparent energy reactive energy demand energy, voltage harmonics up to $51^{st}$ harmonic for all phases, RMS voltage harmonics THD (Total Harmonic Distortion), RMS Voltage Harmonics DC, current harmonics up to $51^{st}$ harmonic for all phases, RMS current harmonics THD, RMS current harmonics DC, spike voltage for all phases, as well as any other known or later-recognized electrical parameter of interest. In the preferred embodiment, a total of 458 parameters can be recorded for an integration period of 1s, 5s, 15s, . . . 1 hour. Additionally, the test device 100 can be used to monitor/measure/store non steady-state "events", e.g., spikes, transient noise patterns and/or occasional unusual noise patterns that can occur upon certain happenings, such as the periodic usage of certain machinery or electronic systems.

Still further, the test device 100 can be used to monitor/measure/store various intentionally imposed signals residing on power lines, such as LAN communication signals, WAN communication signals, point-to-point communication signals, point-to-multipoint communication signals and so on. For example, the test device 100 may be used to detect and store a frequency-shift keyed (FSK) communication signal transmitted over any of power lines P1, P2 and P3

Returning to FIG. 1, once the electrical test device 100 has been programmed, the operator can activate the electrical test device 100 either through a command via the I/O device 120 and I/O port 102, or alternatively activate the electrical test device 100 via a control switch or button located on the surface of the electrical test device 100. Once activated, the electrical test device 100 can perform any of the various above-mentioned actions, including the frequency measurement and storage functions of the above-presented example.

In the present embodiment, the I/O port 102 can communicate with the I/O device 120 via either any number of wired point-to-point communication systems (e.g., RS-232, USB, RS-482, IEEE-488, USB etc), any number of wired LAN technologies (e.g., Ethernet, token ring, etc) as well as any number of known or later developed wired or wireless technologies, such as 802.11, Bluetooth, telephony subscribers line, power line communication, (PLC) links, infrared links, sonic links, and so on.

In turn, the I/O device 120 can communicate with external computer systems via any of the above-mention communication standards as well as any number of long-haul communication systems, e.g., WANs or systems desired to interface with the Internet. For example, in various embodiments the I/O device 120 can implement DSL links, T1 links, E1 links, WANs, cellular-telephony links, cable-modem links, wired-telephony links, satellite links, FM radio links, TCP/IP links, and other existing communication standards capable of accomplishing the same task.

While the present test device 100 can be powered solely by the internal battery 110, it should be appreciated that using the optional power conversion circuitry 112, the test device 110 can convert external AC or DC power to recharge the battery and/or power the test device 100. For example, by using a standard UL-approved AC-to-DC converter plugged into an available wall-socket, the conversion circuitry 112 can be used to provide system power and to keep the battery 110 changed in case power is later lost to the AC-to-DC converter.

Figure 5:
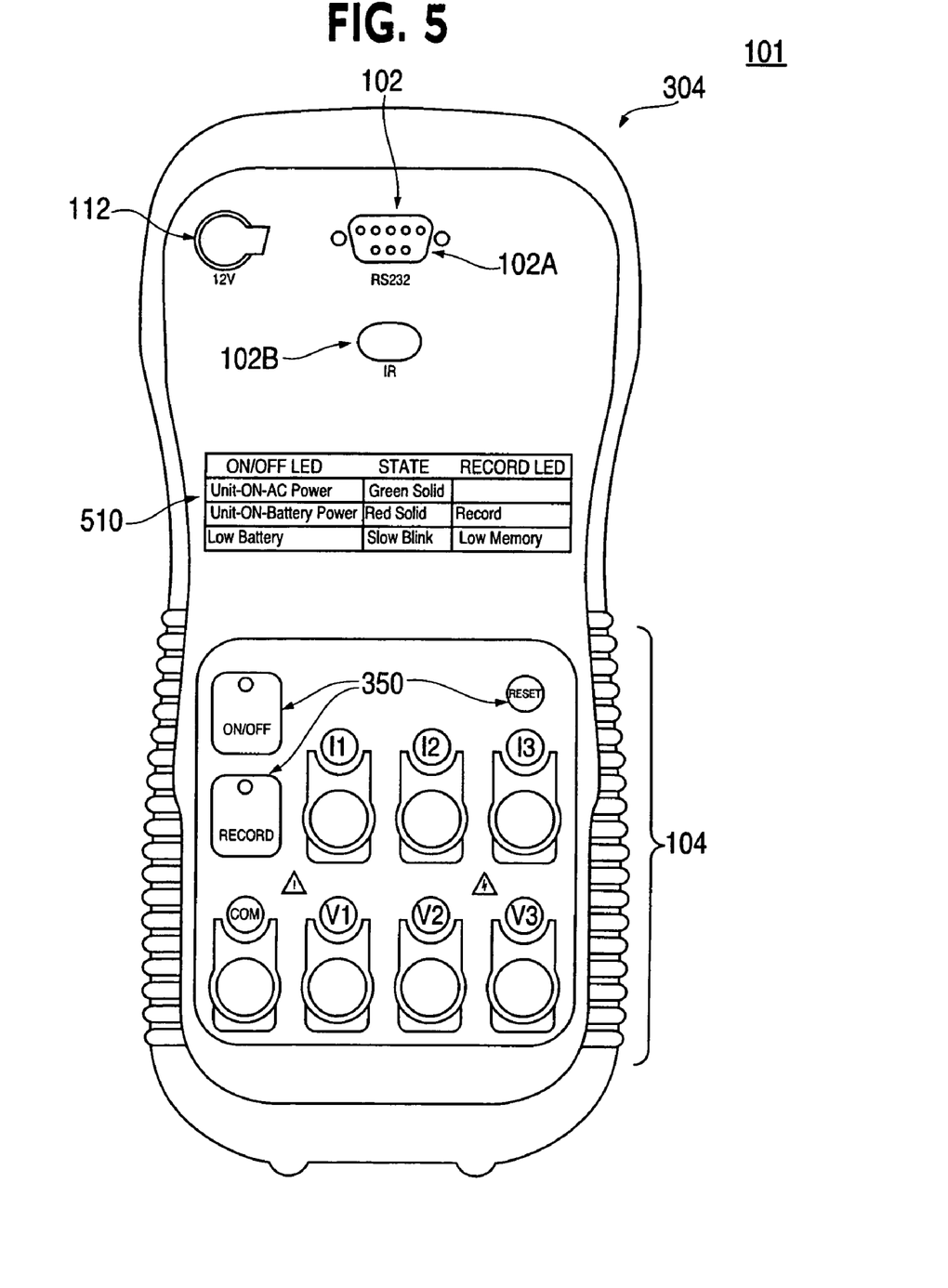
FIG. 5 depicts an exemplary embodiment of an electrical test device.

FIG. 5 depicts an exemplary embodiment of an electrical device 101. As shown in FIG. 5, the exemplary test device 101 has a substantially sealed shell 304 capable of resisting environmental contamination with a plurality of sensor ports 104 each of which can be coupled to an electrical probe. While the exemplary shell 304 is water/moisture resistant, it should be appreciated that in other embodiments the shell 304 can be made completely impervious to environmental contamination, as well as resistant to harsh chemicals and high temperatures.

Returning to FIG. 5, the shell 304 is also equipped with an I/O port 102, optional external power conversion circuitry (not shown), an operator interface 350, and a display panel 510. In the embodiment of FIG. 5, the I/O port 102 can communicate with an external device via either a RS-232 link 102A, an infrared link 102B or a Bluetooth link (not shown). The sensor ports 104 of the exemplary test device 101 includes seven separate ports: three voltage ports, three current ports and one port for a common line. The operator interface 350 contains three buttons: an on/off button, a record (start) button, and a reset button. The exemplary display panel 510 contains single multi-colored light-emitting indicators for indicating power status. It should be appreciated that the lack of a display, other than a mere single LED makes the test device 101 extremely cost effective compared to competitive devices having complex displays. The minimal control buttons offer the same advantage.

As with the example of FIG. 1, the present electrical test device 101 is capable of running from a battery wholly contained within the shell 304 or alternatively configured to run from an external power supply via a power supply jack 112 embedded within the shell.

Figure 1B:
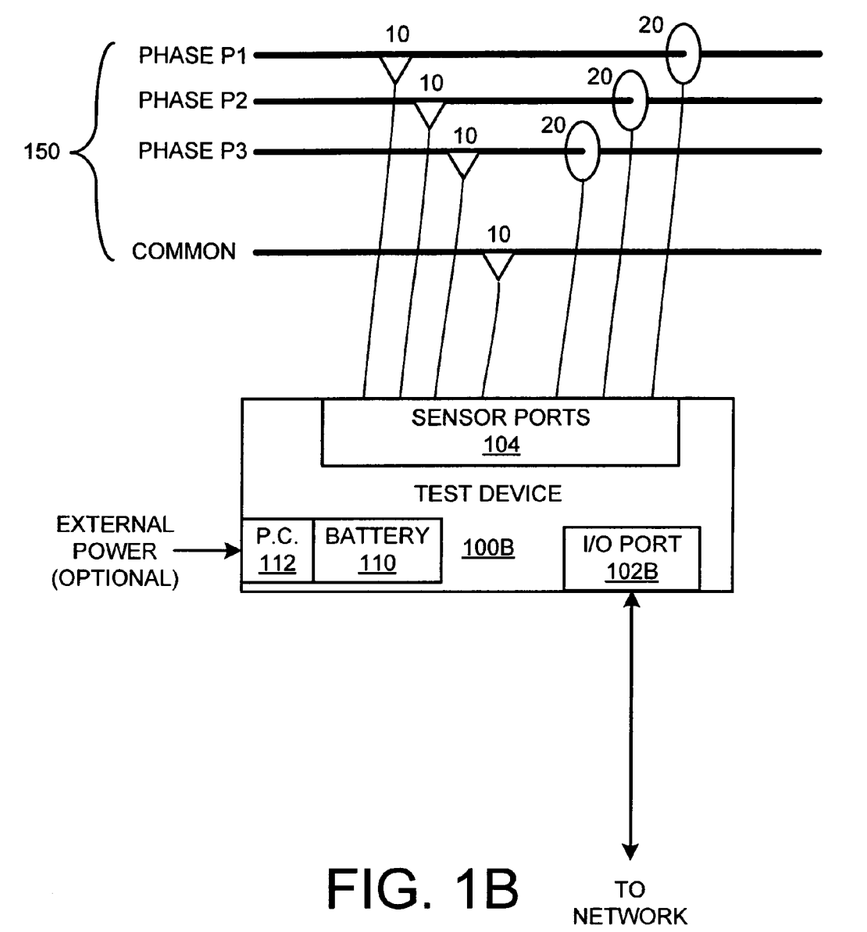
FIG. 1B depicts an exemplary three-phase electrical power system along with a modified test device of a second embodiment not requiring a separate input/output device.

FIG. 1B depicts the three-phase electrical power system 150 of FIG. 1 along with a modified test device 100B similar to the test device 100 of FIG. 1, but with a modified I/O port 102B devised in such a way as to allow the test device 100B to communicate across long distances without the need of a separate input/output device. While the modified test device 100B can be configured with any of the above-mentioned communication standards of its predecessor of FIG. 1, the modified test device 100B can alternatively (or additionally) incorporate any of the above-mentioned long-haul communications technologies. While the modified test device 100B has noted communication advantages over the test device 100 of FIG. 1, it should be appreciated that such capacity comes at the added expense of added electronics, increasing complex software and increased (potentially) power requirements that might be burdensome in certain situations.

Figure 1C:
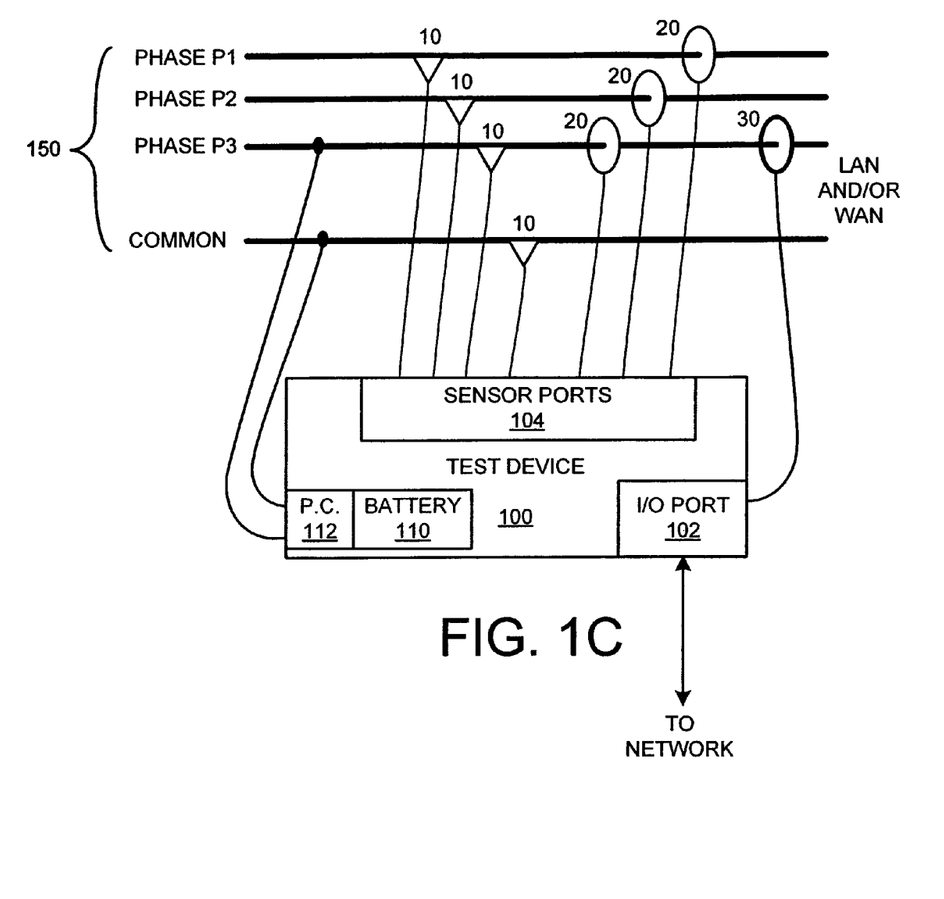
FIG. 1C depicts a three-phase electrical power system of FIG. 1 along with yet another embodiment of an electrical test device.

FIG. 1C depicts the three-phase electrical power system 150 of FIG. 1 along with a second modified test device 100C similar to the test device 100 of FIG. 1, but with a modified I/O port 102C capable of power line communications (PLC) as well as optional power conversion circuitry 112 capable of drawing power directly from an external power system, such as the three-phase electrical power system 150, without an external adapter. By adapting the modified I/O port 102C to communicate using any known or later developed power line LAN or WAN communication technology, such Homeplug or DSL over power line, the modified test device 100C can be placed for nearly indefinite times in highly inaccessible locations where a communications infrastructure may not be available, such as atop power line structures or remote power transformers.

Still further, the modified test device 100C can be placed at various locations within a large commercial or military aircraft where a communications infrastructure may not be available in order to monitor power systems and report any anomalies as various mechanical devices, e.g., landing gear, are deployed or various electronic systems, e.g., radar, are engage. Similarly, the modified test device 100C can be placed at various locations within a commercial or military ship to monitor power systems and report any anomalies as various mechanical devices, e.g., elevators, are deployed or various electronic systems, e.g., radar or sonar, are engage.

Figure 2:
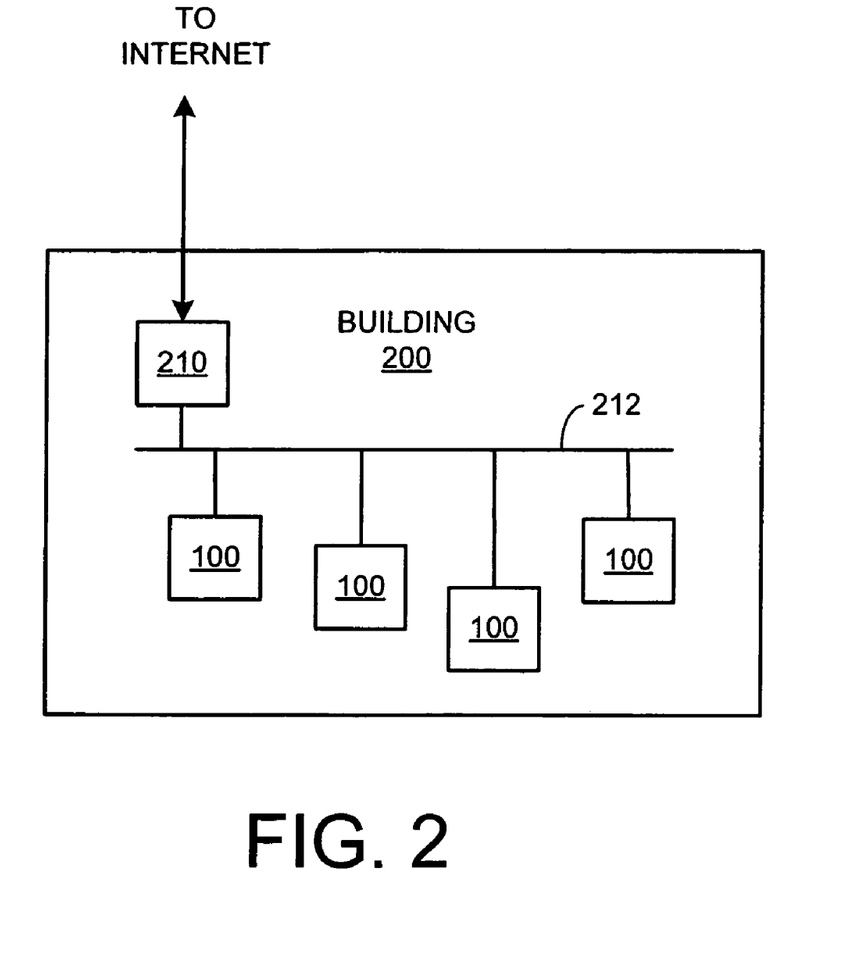
FIG. 2 depicts an in-building wiring system having a number of test devices and an input/output device.

FIG. 2 depicts an in-building wiring system having a number of test devices 100 and an input/output device 210. As shown inside building 200, a number of test devices 100 are connected to the communication device 210 via communication network 212 (e.g. an Ethernet network). By channeling communications from all the test devices 100 to a single communication device 210, the various test devices 100 can communicate with an external network, such as the Internet via any combination of communication standards with a minimum of support hardware.

Figure 2B:
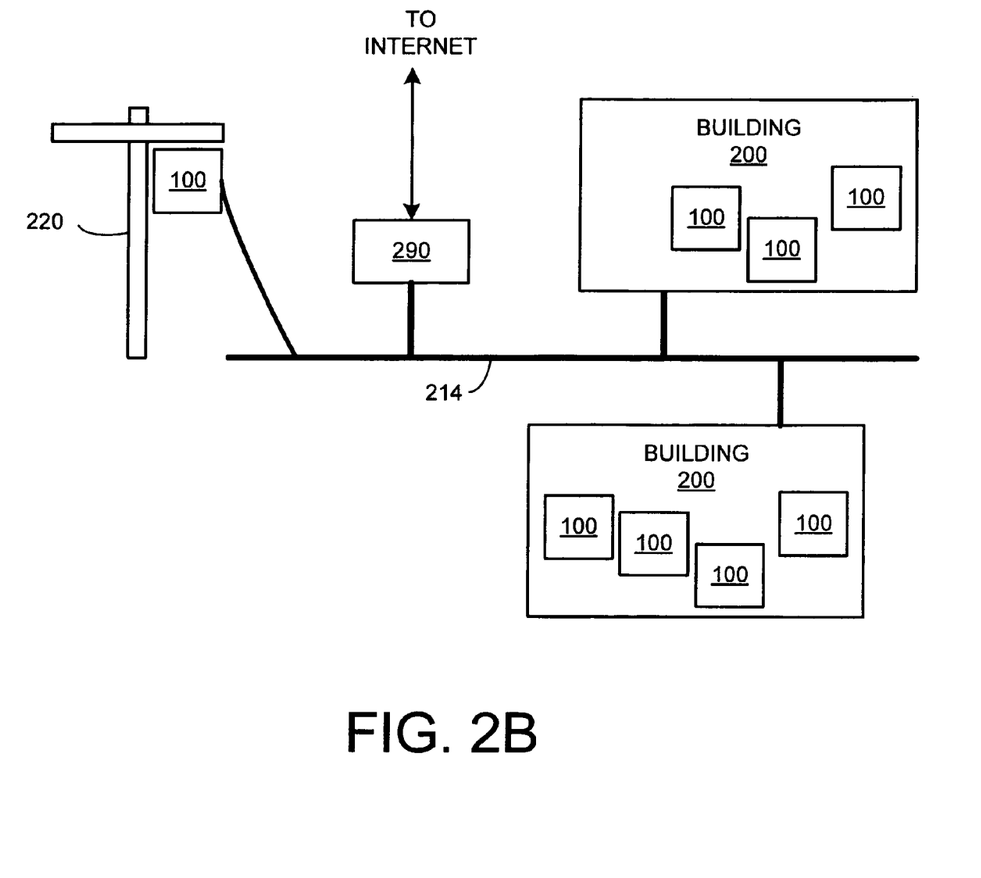
FIG. 2B depicts a number of buildings having a network of test devices.

FIG. 2B is yet another embodiment of a network of test devices disposed among a number of buildings 200 and a power-line structure 220. In the present example, the power-line structure 220 has a single test device 100 and each building 200 has a variety of test devices 100 interconnected via internal power lines. By coupling the input/output device 210 and the various test device 100 via PLC signals traversing the power network 214, a wide-ranging network of test devices can monitor a wide area with a minimal amount of added infrastructure. While the present embodiment uses PLC communications for communication between the test devices 100 and the input/output device 210, other approaches, such as the use of a Bluetooth or 802.11 wireless network technology may similarly be used to reduce or eliminate adding burdensome communication infrastructure.

Figure 3:
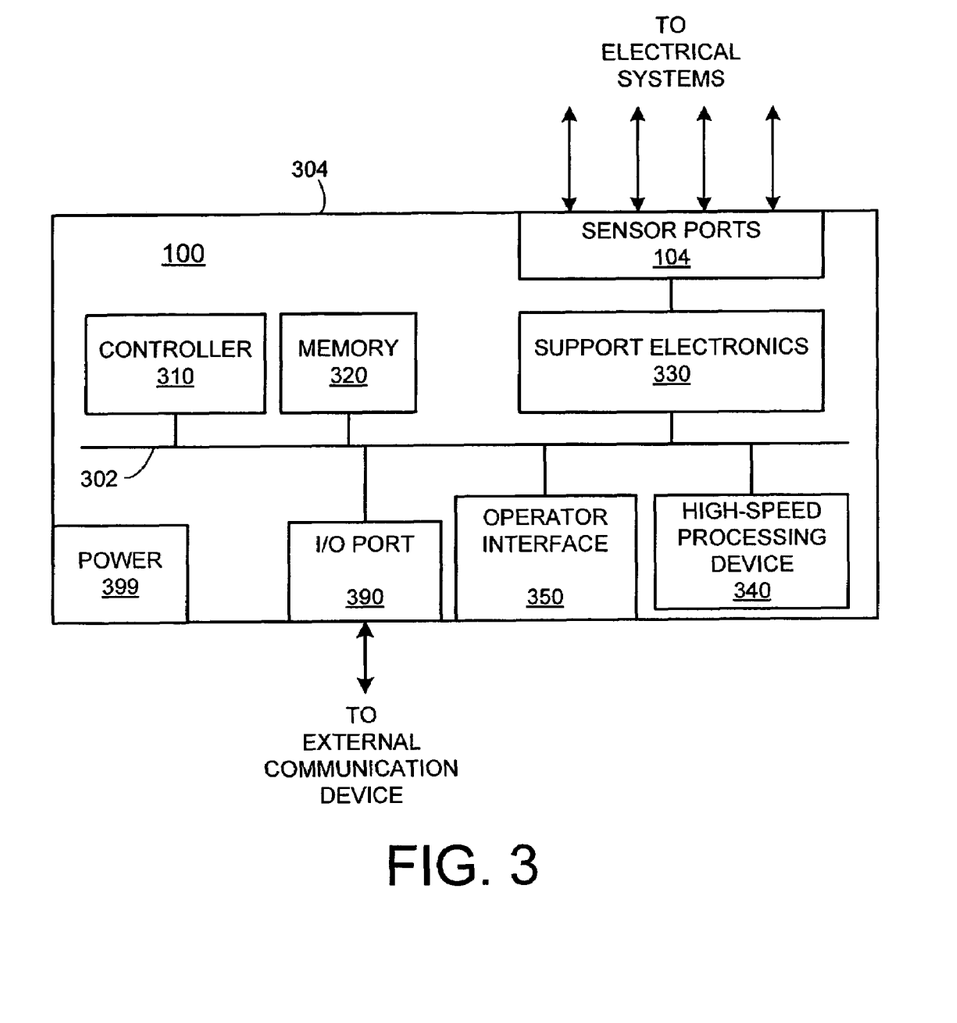
FIG. 3 is a block diagram for the test device of FIG. 1.

FIG. 3 is block diagram of an exemplary test device 100. As shown in FIG. 3, the test device 100 includes a controller 310, a memory 320, a collection of support electronics 330 connected to a set of sensor ports 104, a high-speed processing device 340, an operator interface 350, an I/O port 390, and a power system 399. Various above-mention components 310-390 couple together via control/data bus 302. The power system 399, while not shown as directly connected to various components 302-390, is nonetheless coupled to components 310-390 to provide power. The power system 399 can be any combination of battery and/or external power related systems described above or any other known or later developed systems capable of powering such system.

Although the exemplary memory test device 100 of FIG. 3 uses a bussed architecture, it should be appreciated that other known or later developed architecture may be used as is well known to those of ordinary skill in the art.

It also should be appreciated that some of the above-listed components can take the form of software/firmware routines residing in memory 320 capable of being executed by the controller 310. More particularly, it should be understood that the functions of any or all of components 330-390 can be accomplished, in whole or in part, by using software routines residing in memory 320, as supposed to dedicated electronic hardware.

In operation, various electrical signals derived from various devices, such as an electrical power system, can be fed to the test device 100 via the sensor ports 104. The electrical signals are then passed from the sensor ports 104 to the support electronics 330. Once received by the support electronics 330, any number of well known or novel processes on the various electronic signals may be performed, including (but not limited to) buffering, gain/amplification, filtering and analog-to-digital conversion.

Further, the support electronics 330 can also include various useful controls systems, such as any number of systems used for triggering operations. For convention devices, such as oscilloscopes, a conventional trigger can allow a user to stabilize repeating waveforms and capture single-shot waveforms. Such trigger also makes repeating waveforms appear static on an oscilloscope display. For example, an external trigger is a pulse from an external source connected to a dedicated input on the scope, and an edge trigger is an edge-detector that generates a pulse when the input signal crosses a specified threshold voltage in a specified direction. Trigger can also be used to detect voltage, slope, acceleration and any combination of these elements. Furthermore, a trigger can also be used to measure the start and stop of an event. However, in the present system, this triggering operation is not necessarily applicable for immediate display but can be used to start data acquisition and pass on various event flags to the controller 310.

Still further, the support electronics 330 can include other various computer related functions, including direct memory access (DMA), timers and so on.

As data is collected, it should be appreciated that the test device 100 can be operated in various modes depending on the type of data sought. For example, the test device 100 can be programmed to measure and store discrete events, such as a voltage spike, or the support electronics 330 can periodically use the trigger to alert the controller 310 and or the high-speed processing device 340 that particular signal has been received that conforms with a predetermined triggering requirement. Upon such a triggering event, the high-speed processing device 340 can process the digitized data using various processes of interest, such as filtering, etc. After data is processed accordingly, the high-speed processing device 340 can store the resultant processed data into the memory 320 or alternatively deliver the processed data to an external communication device via I/O port 390.

Alternatively, in a situation where the steady state data is desired, the high speed processing device 340 may not require any trigger but may be programmed to operate on data directly produced by support electronics 330 to provide processed information either to the memory 320 or to the external communication device via I/O port 390.

Figure 4:
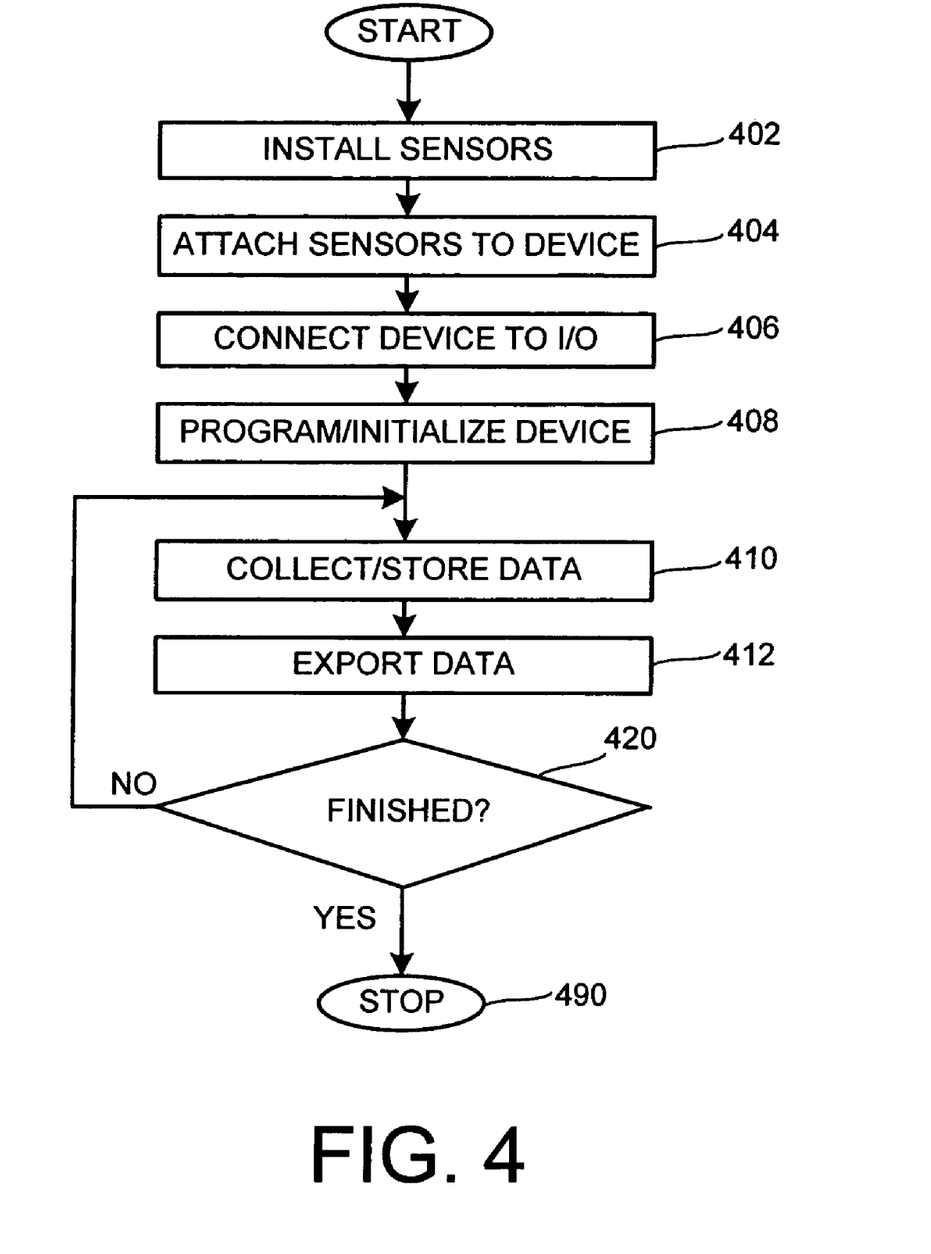
FIG. 4 depicts a flow chart representing an exemplary process for use in measuring various electrical systems.

FIG. 4 is a flowchart outlining an exemplary operation according to the present methods and systems. The process starts at step 402 where a number of sensors are installed on an electrical system, such as the electrical power system 150 shown in FIGS. 1-1C. Such sensors can include voltage probes, current probes, magnetic sensors, and so on. Next, in step 404, the sensors of step 402 are attached to a test device, such as any of the test devices described above. Control continues to step 406.

In step 406, the test device of step 404 is connected to an I/O device, such as a personal computer, a PDA, a wireless router and so on. Next, in step 408, the test device can be programmed and optionally initialized/started via the I/O device of step 406 using any number of computer-based systems. Alternatively, the test device may be initialized/started by activating a simple control on the surface of the test device. Control continues to step 410.

In step 410, the test device, once initialized, can collect/store data as described above with respect to the earlier figures. Next, in step 412, the various collected and stored data can be exported to any number of external devices either periodically or upon external command. Control continues to step 420.

In step 420, a determination is made as to whether the process of data collection is finished. If data collection is finished, control is continues to step 490 where the process stops; otherwise, the control jumps back to step 410 where the process continues.

In various embodiments where the above-described systems and/or methods are implemented using a programmable device, such as a computer-based system or programmable logic, it should be appreciated that the above-described systems and methods can be implemented using any of various known or later developed programming languages, such as "C", "C++", "FORTRAN", Pascal", "VHDL" and the like.

Accordingly, various storage media, such as magnetic computer disks, optical disks, electronic memories and the like, can be prepared that can contain information that can direct a device, such as a computer, to implement the above-described systems and/or methods. Once an appropriate device has access to the information and programs contained on the storage media, the storage media can provide the information and programs to the device, thus enabling the device to perform the above-described systems and/or methods.

For example, if a computer disk containing appropriate materials, such as a source file, an object file, an executable file or the like, were provided to a computer, the computer could receive the information, appropriately configure itself and perform the functions of the various systems and methods outlined in the diagrams and flowcharts above to implement the various functions. That is, the computer could receive various portions of information from the disk relating to different elements of the above-described systems and/or methods, implement the individual systems and/or methods and coordinate the functions of the individual systems and/or methods related to data collecting.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A portable, remote, externally-programmable electrical testing apparatus, comprising:
   a plurality of ports configured to couple to respective electrical probes for receiving electrical data input;
   a communications subsystem configured to receive testing parameter information from an external computer system and to transmit measurement information to the external computer system; and
   a processing subsystem coupled to both the communications subsystem and the plurality of ports and structured to (i) configure a testing protocol based upon testing parameter information received by the communications subsystem, (ii) activate at least a subset of the plurality of ports to receive electrical data input, based upon the testing protocol, (iii) perform measurements on the electrical data input to the ports, and (iv) send processed data to the communications subsystem to transmit as measurement information to the external computer system; and
   a portable housing configured to enclose the communications subsystem and the processing subsystem, wherein the portable housing includes the plurality of ports, and further wherein the electrical probes receive electrical data from outside the portable housing,
   wherein at least a subset of the plurality of ports are configured to couple to probes that in turn are coupled to a three-phase power system for determining electrical parameters of interest associated with power lines in the power system.

2. The portable, remote, externally-programmable electrical testing apparatus of claim 1, wherein the communications subsystem is configured to communicate over a network to the external computer system.

3. The portable, remote, externally-programmable electrical testing apparatus of claim 1, wherein the communications subsystem is configured to communicate over a wireless communications link to the external computer system.

4. The portable, remote, externally-programmable electrical testing apparatus of claim 1, further comprising a power supply subsystem powered by a direct current battery contained within the apparatus.

5. The portable, remote, externally-programmable electrical testing apparatus of claim 1 further comprising a power supply subsystem capable of drawing power from the three phase electrical power system being tested.

6. The portable, remote, externally-programmable electrical testing apparatus of claim 1, wherein the communications subsystem is configured to connect to an Ethernet network of a plurality of electrical testing apparatuses, each communicating with the external computer system.

7. The portable, remote, externally-programmable electrical testing apparatus of claim 1, wherein the communications subsystem is configured to communicate utilizing a power line communications link.

8. The portable, remote, externally-programmable electrical testing apparatus of claim 3, wherein the communications subsystem is configured to communicate utilizing an infrared link.

9. A portable, remote, externally-programmable electrical testing apparatus, comprising:
  a plurality of ports configured to couple to respective electrical probes for receiving electrical data input;
  a communications subsystem configured to receive testing parameter information from an external computer system and to transmit measurement information to the external computer system; and
  a processing subsystem coupled to both the communications subsystem and the plurality of ports and structured to (i) configure a testing protocol based upon testing parameter information received by the communications subsystem, (ii) activate at least a subset of the plurality of ports to receive electrical data input, based upon the testing protocol, (iii) perform measurements on the electrical data input to the ports, and (iv) send processed data to the communications subsystem to transmit as measurement information to the external computer system; and
  a portable housing configured to enclose the communications subsystem and the processing subsystem, wherein the portable housing includes the plurality of ports, and further wherein the electrical probes receive electrical data from outside the portable housing,
  wherein the communications subsystem is further configured to receive activation commands, and the testing protocol commences in the processing subsystem upon receipt of an activation command by the communications subsystem.

10. The portable, remote, externally-programmable electrical testing apparatus of claim 9, wherein the communications subsystem is configured to communicate over a network to the external computer system.

11. The portable, remote, externally-programmable electrical testing apparatus of claim 9, wherein the communications subsystem is configured to communicate over a wireless communications link to the external computer system.

12. The portable, remote, externally-programmable electrical testing apparatus of claim 9, further comprising a power supply subsystem powered by a direct current battery contained within the apparatus.

13. The portable, remote, externally-programmable electrical testing apparatus of claim 9, further comprising a power supply subsystem capable of drawing power from the three phase electrical power system being tested.

14. The portable, remote, externally-programmable electrical testing apparatus of claim 9, wherein the communications subsystem is configured to connect to an Ethernet network of a plurality of electrical testing apparatuses, each communicating with the external computer system.

15. The portable, remote, externally-programmable electrical testing apparatus of claim 9, wherein the communications subsystem is configured to communicate utilizing a power line communications link.

16. The portable, remote, externally-programmable electrical testing apparatus of claim 11, wherein the communications subsystem is configured to communicate utilizing an infrared link.

17. A portable, remote, externally-programmable electrical testing apparatus, comprising:
  a plurality of ports configured to couple to respective electrical probes for receiving electrical data input;
  a communications subsystem configured to receive testing parameter information from an external computer system and to transmit processed measurement information to the external computer system; and
  a processing subsystem coupled to the communications subsystem and configured to (i) execute a testing protocol based upon testing parameter information received by the communications subsystem, (ii) detect a triggering event as defined according to the testing protocol, based upon input from at least one of the ports, (iii) generate measurement information based upon the electrical data input to the ports upon detection of a triggering event, and (iv) send generated information to the communications subsystem; and
  a portable housing configured to enclose the communications subsystem and the processing subsystem, and wherein the portable housing includes the plurality of ports, and further wherein the electrical probes receive electrical data from outside the portable housing,
  wherein at least a subset of the plurality of ports are coupled via probes to a three-chase cower system for determining electrical parameters of interest associated with power lines in the power system.

18. The portable, remote, externally-programmable electrical testing apparatus of claim 17, wherein the triggering event is a pulse that is received in a port and that exceeds a threshold value specified in the testing protocol.

19. The portable, remote, externally-programmable electrical testing apparatus of claim 17, further comprising a power supply subsystem capable of drawing power from the three phase electrical power system being tested.

20. The portable, remote, externally-programmable electrical testing apparatus of claim 18, wherein the processing subsystem is further configured to cease performing measurements upon the electrical data input to the ports upon the detection of a second triggering event.

* * * * *